(12) United States Patent
Jung et al.

(10) Patent No.: US 9,029,710 B2
(45) Date of Patent: May 12, 2015

(54) TAPE PACKAGE AND DISPLAY APPARATUS HAVING THE SAME

(71) Applicant: Samsung Display Co., Ltd., Yongin, Gyeonggi-Do (KR)

(72) Inventors: Byung-Goo Jung, Goyang-si (KR); Joo-Yeon Won, Seoul (KR); Chong-Guk Lee, Seoul (KR); Sung-Dong Park, Asan-si (KR)

(73) Assignee: Samsung Display Co., Ltd. (KR)

( * ) Notice: Subject to any disclaimer, the term of this patent is extended or adjusted under 35 U.S.C. 154(b) by 196 days.

(21) Appl. No.: 13/706,622

(22) Filed: Dec. 6, 2012

(65) Prior Publication Data

US 2014/0036456 A1  Feb. 6, 2014

(30) Foreign Application Priority Data

Jul. 31, 2012 (KR) .................. 10-2012-0083772

(51) Int. Cl.
| | |
|---|---|
| *H05K 1/00* | (2006.01) |
| *H05K 7/06* | (2006.01) |
| *H05K 1/03* | (2006.01) |
| *H01L 23/495* | (2006.01) |
| *G02F 1/1345* | (2006.01) |

(52) U.S. Cl.
CPC ............ *H05K 7/06* (2013.01); *H05K 1/0393* (2013.01); *H01L 23/49572* (2013.01); *G02F 1/13452* (2013.01); *H01L 2224/16225* (2013.01); *H01L 2224/32225* (2013.01); *H01L 2224/48091* (2013.01); *H01L 2224/48227* (2013.01); *H01L 2224/73204* (2013.01); *H01L 2924/0002* (2013.01)

(58) Field of Classification Search
CPC ........ G02F 1/00; H01L 23/49572; H05K 7/06; H05K 1/0393
USPC .......... 174/260, 261, 254, 258; 361/760, 768, 361/771, 774, 777, 749; 257/668, 692, 735, 257/773
See application file for complete search history.

(56) References Cited

U.S. PATENT DOCUMENTS

| | | | | |
|---|---|---|---|---|
| 5,907,769 | A * | 5/1999 | Corisis | 438/123 |
| 6,278,176 | B1 * | 8/2001 | Nakamura et al. | 257/668 |
| 6,426,467 | B1 * | 7/2002 | Gyouten et al. | 174/260 |
| 7,902,647 | B2 | 3/2011 | Chung et al. | |
| 8,853,838 | B2 * | 10/2014 | Tan | 257/673 |
| 2005/0082647 | A1 * | 4/2005 | Lee et al. | 257/668 |
| 2008/0117376 | A1 | 5/2008 | Takenaka | |
| 2010/0212938 | A1 | 8/2010 | Nakamura et al. | |
| 2011/0139493 | A1 | 6/2011 | Sumida et al. | |

\* cited by examiner

*Primary Examiner* — Yuriy Semenenko
(74) *Attorney, Agent, or Firm* — Cantor Colburn LLP

(57) ABSTRACT

A tape package includes a base substrate, an input lead line disposed on the base substrate, the input lead line including a main input lead line and a sub input lead line, the sub input lead line branching off and extending from the main input lead line, an integrated circuit chip electrically connected to the sub input lead line, and a sealing part fixing the integrated circuit chip on the base substrate and overlapping a portion of the main input lead line.

11 Claims, 7 Drawing Sheets

TAPE PACKAGE AND DISPLAY APPARATUS HAVING THE SAME

This application claims priority to Korean Patent Application No. 10-2012-0083772, filed on Jul. 31, 2012, and all the benefits accruing therefrom under 35 U.S.C. §119, the contents of which are incorporated by reference herein in their entireties.

BACKGROUND

1. Field

Exemplary embodiments of the invention relate to a tape package and a display apparatus having the tape package.

More particularly, exemplary embodiments of the invention relate to a tape package of a liquid crystal display apparatus and a liquid crystal display apparatus having the tape package.

2. Description of the Related Art

Generally, a liquid crystal display apparatus has relatively thin thickness, light weight and low power consumption, and thus the liquid crystal display apparatus is used in monitors, laptop computers and cellular phones and so on. The liquid crystal display includes a liquid crystal display panel displaying images using a light transmittance of a liquid crystal, and a backlight assembly disposed under the liquid crystal display panel and providing light to the liquid crystal display panel.

The liquid crystal display panel is electrically connected to a driving part which drives the liquid crystal display panel. The liquid crystal display panel is electrically connected to the driving part through a tape package.

The tape package includes a circuit wiring on a substrate having flexibility. The tape package has flexibility, so that the tape package may be bent while the liquid crystal display apparatus is manufactured or used. However, the circuit wiring of the tape package may be undesirably cracked or damaged while the liquid crystal display apparatus is manufactured or used.

SUMMARY

One or more exemplary embodiment of the invention provides a tape package capable of preventing a crack of a circuit wiring.

One or more exemplary embodiment of the invention also provides a display apparatus having the tape package.

According to an exemplary embodiment of the invention, a tape package includes a base substrate, an input lead line disposed on the base substrate and including a main input lead line and a sub input lead line, the sub input lead line branching off and extending from the main input lead line, an integrated circuit ("IC") chip electrically connected to the sub input lead line, and a sealing part which fixes the IC chip on the base substrate and overlaps the main input lead line.

In an exemplary embodiment, the tape package may further include a protecting layer overlapping a portion of the input lead line.

In an exemplary embodiment, the protecting layer may overlap the main input lead line. The sealing part may overlap the sub input lead line and a portion of the protecting layer.

In an exemplary embodiment, a distance between a side surface of the IC chip and a bottleneck region which is between the main input lead line and the sub input lead line may be about 25 micrometers (μm) to about 250 μm.

In an exemplary embodiment, a distance from the side surface of the IC chip to the protecting layer may be about 100 μm to 300 μm.

In an exemplary embodiment, a distance from the side surface of the IC chip to the sealing part may be about 400 μm to about 600 μm.

In an exemplary embodiment, the protecting layer exposes a portion of the main input lead line. The sealing part may overlap the sub input lead line, the exposed portion of the main input lead line and a portion of the protecting layer.

In an exemplary embodiment, the tape package may further include a wire which connects the IC chip to the sub input lead line.

In an exemplary embodiment, the base substrate may include a flexible substrate.

In an exemplary embodiment, the tape package may further include a plurality of sub input lead lines. A sum of widths of the sub input lead lines may be smaller than a width of the main input lead line.

In an exemplary embodiment, the input lead line may include a first portion, a second portion connected to the first portion, and a third portion including the main input lead line and the sub input lead line. A width of the first portion may be larger than a width of the third portion.

According to another exemplary embodiment of the invention, a display apparatus includes a tape package including a base substrate, and an output lead line disposed on the base substrate, the output lead line including a main output lead line and a sub output lead line, the sub output lead line branching off and extending from the main output lead line, a display panel connected to the sub output lead line, and a reinforcing part which fixes the tape package to the display panel and overlaps a portion of the main output lead line.

In an exemplary embodiment, the reinforcing part may overlap a bottleneck region which is between the main output lead line and the sub output lead line.

In an exemplary embodiment, the bottleneck region may be spaced apart from a side of the display panel by about 0.5 to 1.3 mm.

In an exemplary embodiment, the tape package may further include a protecting layer between the output lead line and the reinforcing part.

In an exemplary embodiment, the tape package may further include a plurality of sub output lead lines. A sum of widths of the sub output lead lines may be smaller than a width of the main output lead line.

In an exemplary embodiment, the display apparatus may further include a conductive adhesive layer on the display panel and which connects the sub output lead line of the tape package to the display panel. The conductive adhesive layer may include a plurality of conductive channels spaced apart from each other In an exemplary embodiment, the tape package may further include an input lead line disposed on the base substrate and including a main input lead line and a sub input lead line, the sub input lead line branching off and extending from the main input lead line, an IC chip electrically connected to the sub input lead line, and a sealing part which fixes the IC chip on the base substrate and overlaps a portion of the main input lead line.

In an exemplary embodiment, the display apparatus may further include an upper receiving container receiving the display panel, a body disposed under the display panel, a lower receiving container receiving the body, a hinge about which the upper receiving container and the display panel rotates with respect to the body and the lower receiving container, and a driving part disposed under the hinge, received in the lower receiving container and electrically connected to the input lead line of the tape package.

In an exemplary embodiment, the tape package may be bent in a C-shape and surround the driving part. The IC chip may face the driving part According to one or more exemplary embodiment of the invention, the tape package includes the base substrate, the bottleneck region of the third portion of the input lead line and the sealing part. The bottleneck region of the third portion of the input lead line is disposed under the sealing part. Although the tape package is bent by an external force, the portion of the base substrate corresponding to the bottleneck region may be hardly bent because of the sealing part. Thus, a crack of the circuit pattern in the bottleneck region may be reduced or effectively prevented.

In addition, the display apparatus includes the tape package having the bottleneck region of the first portion of the output lead line, the reinforcing part and the display panel. The bottleneck region of the third portion of the output lead line is disposed on the reinforcing part. Although the tape package is bent by an external force, a portion of the tape package corresponding to the bottleneck region may be hardly bent because of the reinforcing part. Thus, a crack of the circuit pattern in the bottleneck region may be reduced or effectively prevented.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1:
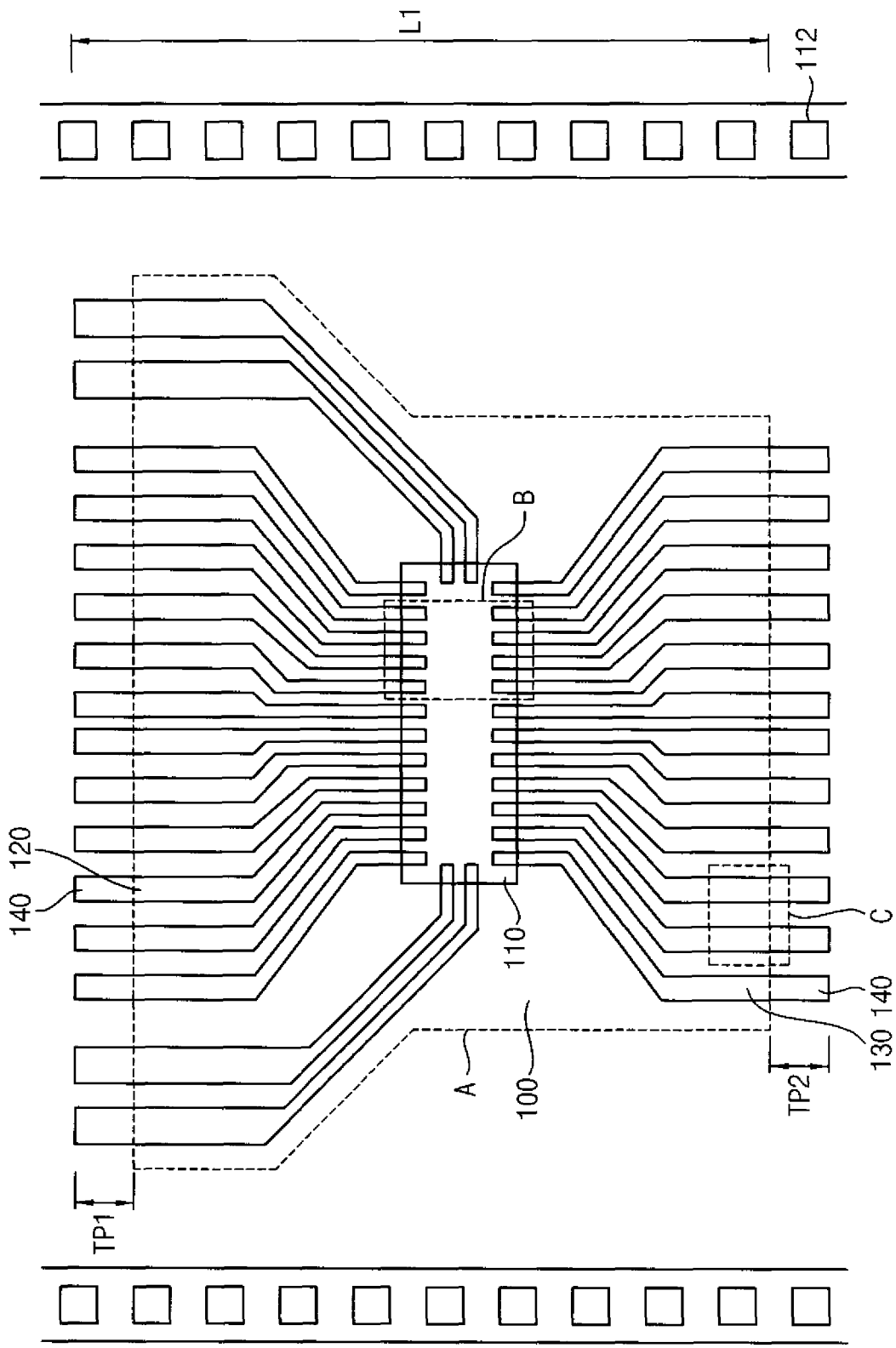
FIG. 1 is a plan view illustrating an exemplary embodiment of a tape package according to the invention.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" or "under" relative to other elements or features would then be oriented "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be explained in detail with reference to the accompanying drawings.

FIG. 1 is a plan view illustrating an exemplary embodiment of a tape package according to the invention.

Referring to FIG. 1, the tape package includes a base substrate 100, an integrated circuit ("IC") chip mounting area 110 and a circuit pattern. The circuit pattern includes an output lead line 130, an input lead line 120 and a test pad 140.

The circuit pattern may include a plurality of output lead lines 130, a plurality of input lead lines 120 and/or a plurality of test pads 140.

The base substrate 100 includes a material having relatively high flexibility. In one exemplary embodiment, for example, the base substrate 100 may include polyimide and/or epoxy resin. The tape package has a first length L1 and is on the base substrate 100. In an exemplary embodiment of manufacturing the tape package, a plurality of sprocket holes 112 may be formed on the base substrate 100 to make a manufacturing process easier.

The IC chip mounting area 110 is disposed in area 'A' on the base substrate 100. The IC chip (refer to 200 of FIG. 3) is disposed on the IC chip mounting area 110.

The input lead line 120 is disposed in the area 'A' on the base substrate 100. The input lead line 120 is physically and/or electrically connected to the IC chip mounting area 110 and/or components within the IC chip mounting area 110. A detailed explanation about the input lead line 120 will be explained with reference to FIG. 2.

The output lead line 130 is disposed in the area 'A' on the base substrate 100. The output lead line 130 is physically and/or electrically connected to the IC chip mounting area 110 and/or components within the IC chip mounting area 110. A detailed explanation about the output lead line 130 will be explained with reference to FIG. 2.

The test pad 140 is disposed on the base substrate 100. The test pad 140 may be disposed at both of opposing ends of the tape package having the first length L1. Thus, the test pad 140 is disposed in area TP1 and area TP2, respectively. The test pad 140 which is disposed in the area TP1 is physically and/or electrically connected to the input lead line 120. The test pad 140 which is disposed in the area TP2 is physically and/or electrically connected to the output lead line 130.

In an exemplary embodiment of manufacturing the tape package, the test pad 140 is employed for testing a function of the tape package before cutting the area 'A' of the tape package. After testing the function of the tape package using the test pad 140, the areas TP1 and TP2 are cut or removed from a remaining portion of the tape package, so that the tape package in the area 'A' is completed.

Figure 8A:
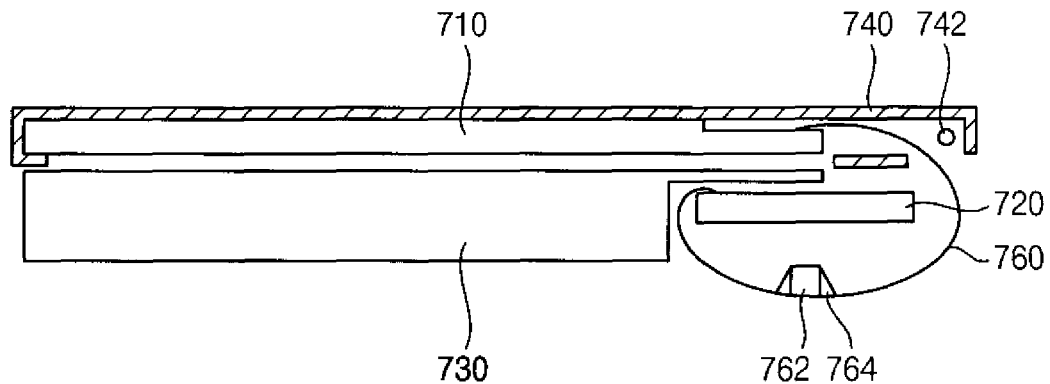
FIGS. 8A to 8B are cross-sectional views of exemplary embodiments of a display apparatus according to the invention.
Figure 8B:
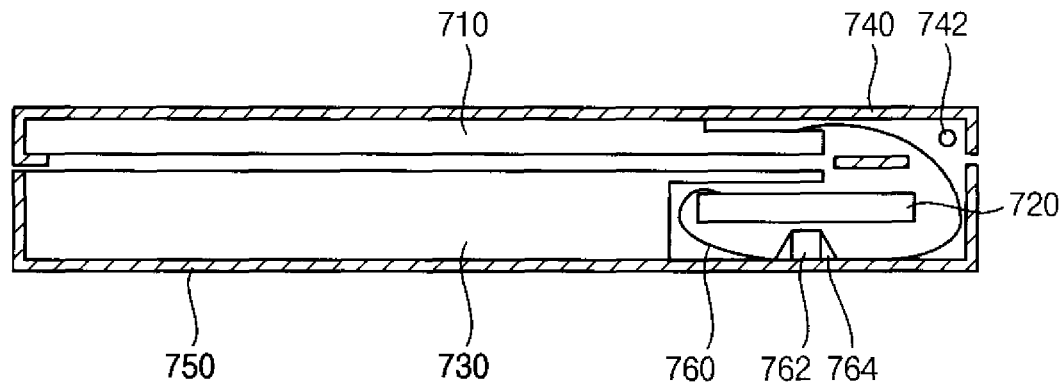

The input lead line 120 of the tape package is physically and/or electrically connected to a driving part of a display apparatus (refer to 720 of FIG. 8B). The output lead line 130 is physically and/or electrically connected to a display panel of the display apparatus (refer to 710 of FIG. 8B).

Figure 2:
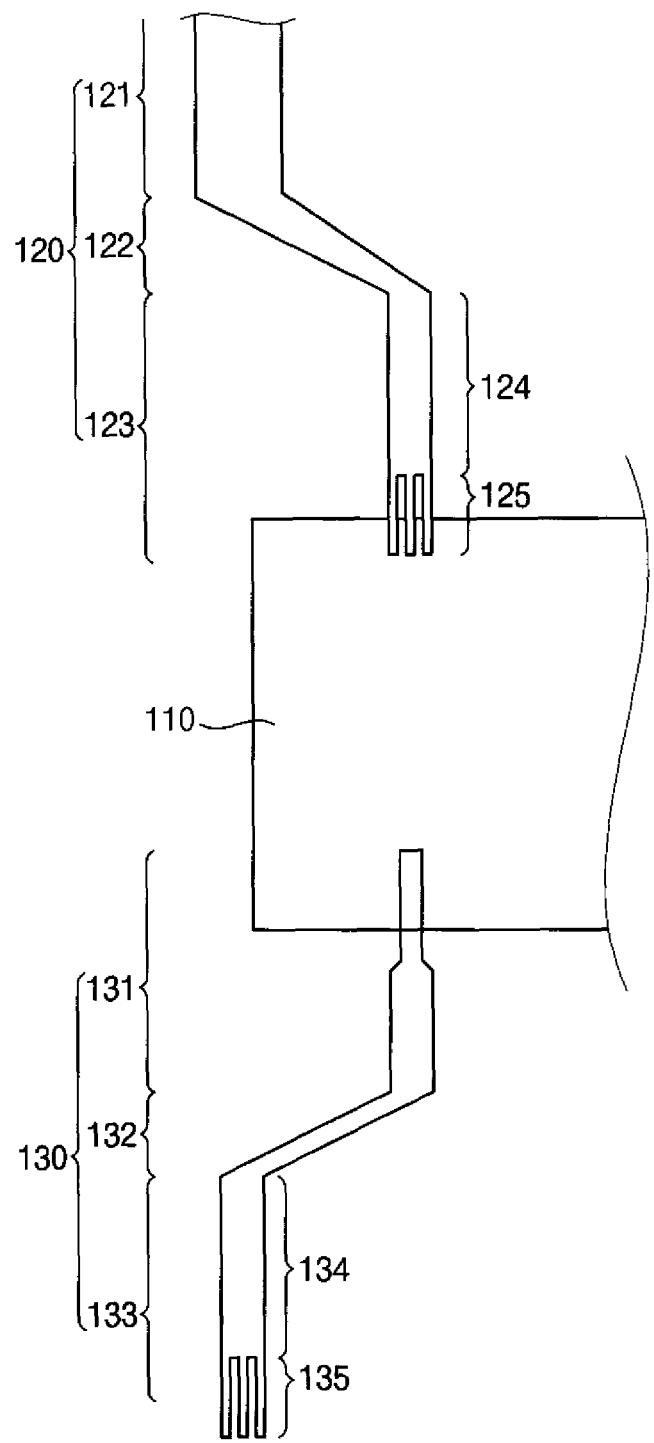
FIG. 2 is an enlarged view illustrating an exemplary embodiment of an input lead and an output lead of FIG. 1.

FIG. 2 is an enlarged view illustrating an exemplary embodiment of an input lead and an output lead of FIG. 1.

Referring to FIG. 2, the input lead line 120 includes a first portion 121, a second portion 122 and a third portion 123. The output lead line 130 includes a first portion 131, a second portion 132 and a third portion 133. The first through third portions 121-123 of the input lead line 120, and/or the first through third portions 131-133 of the output lead line 130 may respectively form a single, unitary indivisible line unit.

The first portion 121 of the input lead line 120 is connected to the driving part of the display apparatus (refer to 720 of FIG. 8B). The second portion 122 of the input lead line 120 is connected to the first portion 121. The third portion 123 of the input lead line 120 is connected to the second portion 122. The third portion 123 is connected to the IC chip mounting area 110. Each of the first portion 121, the second portion 122 and the third portion 123 has a longitudinal axis, and a width of a respective portion is taken perpendicular to the respective longitudinal axis.

The third portion 123 of the input lead line 120 includes a main input lead line 124 and a sub input lead line 125. The sub input lead line 125 branches off and extends from the main input lead line 124. The third portion 123 of the input lead line 120 may include a plurality of sub input lead lines 125. Each of the main input lead line 124 and the sub input lead line 125 has a longitudinal axis. The longitudinal axes may be parallel to each other, but are not limited thereto or thereby. A width taken perpendicular to the longitudinal axis of the sub input lead line 125 is smaller than a width of the main input lead line 124, so that a bottleneck region is formed between the main input lead line 124 and the sub input lead line 125.

A width of the first portion 121 of the input lead line 120 is greater than a width of the third portion 123. For a plurality of input lead lines 120, a sum of the widths of the first portions 121 of the input lead lines 120 is greater than a sum of the widths of the third portions 123. Thus, the first portion 121 which is connected to the driving part has a relatively large width, and is relatively far from an adjacent input lead line 120. In addition, the third portion 123 which is connected to the IC chip mounting area 110 has a relatively small width, and is relatively close to an adjacent input lead line 120. Thus, terminals of the IC chip (refer to 202 of FIG. 3) which are disposed in a relatively small planar area may be connected to terminals of the driving part (refer to 720 of FIG. 8B) which are disposed in a relatively large planar area through a plurality of input lead lines 120.

The first portion 131 of the output lead line 130 is connected to the IC chip mounting area 110. The second portion 132 of the output lead line 130 is connected to the first portion 131. The third portion 133 of the output lead line 130 is connected to the second portion 132. The third portion 133 is connected to a display panel of the display apparatus (refer to 710 of FIG. 8B). Each of the first portion 131, the second portion 132 and the third portion 133 has a longitudinal axis, and a width of a respective portion is taken perpendicular to the respective longitudinal axis.

The third portion 133 of the output lead line 130 includes a main output lead line 134 and a sub output lead line 135. The sub output lead line 135 branches off and extends from the main output lead line 134. The third portion 133 of the output lead line 130 may include a plurality of sub output lead lines 135. Each of the main output lead line 134 and the sub output lead line 135 has a longitudinal axis. The longitudinal axes may be parallel to each other, but are not limited thereto or thereby. A width taken perpendicular to the longitudinal axis of the sub output lead line 135 is smaller than a width of the main output lead line 134, so that a bottleneck region is formed between the main output lead line 134 and the sub output lead line 135.

A width of the third portion 133 of the output lead line 130 is greater than a width of the first portion 131. For a plurality of output lead lines 130, a sum of the widths of the third portions 133 of the output lead lines 130 is greater than a sum of the widths of the first portions 131. Thus, the third portion 133 which is connected to the display panel has a relatively large width, and is relatively far from an adjacent output lead line 130. In addition, the first portion 131 which is connected to the IC chip mounting area 110 has a relatively small width, and is relatively close to an adjacent output lead line 130. Thus, terminals of the IC chip (refer to 202 of FIG. 3) which are disposed in a relatively small planar area may be connected to terminals of the display panel (refer to 710 of FIG. 8B) which are disposed in a relatively large planar area through a plurality of output lead lines 130.

Figure 3:
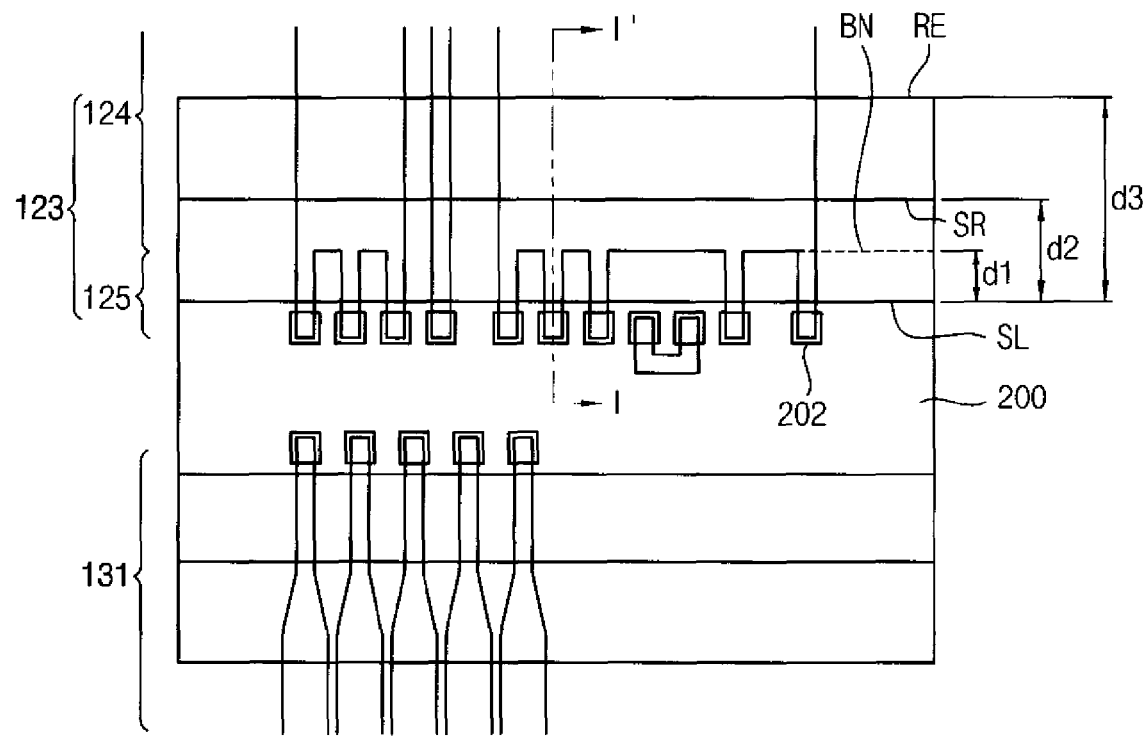
FIG. 3 is an enlarged view illustrating portion 'B' of FIG. 1.
Figure 4:
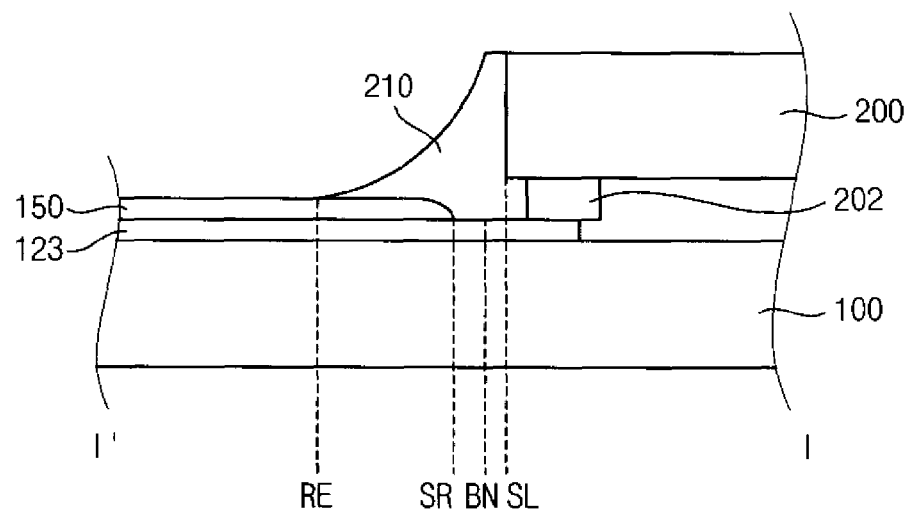
FIG. 4 is a cross-sectional view taken along line I-I' of FIG. 3.

FIG. 3 is an enlarged view illustrating portion 'B' of FIG. 1. FIG. 4 is a cross-sectional view taken along line I-I' of FIG. 3.

Referring to FIGS. 3 and 4, an IC chip 200, a protecting layer 150 and a sealing part 210 are disposed on the tape package of FIG. 1.

The protecting layer 150 is disposed on and overlapping the input lead line (refer to 120 of FIG. 1) and the output lead line (refer to 130 of FIG. 1). The protecting layer 150 insulates and protects a circuit pattern including the input lead line and the output lead line. The protecting layer 150 exposes (e.g., does not overlap) a portion of the input lead line 120. The protecting layer 150 extends to a protecting layer line SR. A portion of the main input lead line 124 of the third portion 123 of the input lead line 120, and the sub input lead line 125 are exposed by the protecting layer 150. Thus, the protecting layer 150 does not overlap and exposes a bottleneck line BN which is between the main input lead line 124 and the sub input lead line 125. The bottleneck line BN may be a boundary between the main input lead line 124 and the sub input lead line 125. The protecting layer 150 may include a solder resist, but is not limited thereto or thereby.

The IC chip 200 is disposed on the IC chip mounting area 110. The IC chip 200 includes a plurality of terminals 202 disposed on a lower surface and under the IC chip 200. The terminals 202 are disposed on the exposed sub input lead line 125, so that the IC chip 200 is physically and/or electrically connected to the input lead line (refer to 120 of FIG. 1).

A group of terminals among the plurality of terminals 202 to which same signal is applied, may be respectively connected to the sub input lead lines 125 from a single one main input lead line 124.

The sealing part 210 surrounds the IC chip 200 to fix the IC chip 200 on the base substrate 100. The sealing part 210 may be disposed around edges of the IC chip 200 in a plan view of the tape package, such that the sealing part 210 surrounds the IC chip 200. The sealing part 210 covers (e.g., overlaps) a side surface of the IC chip 200, a portion of the input lead line 120 and a portion of the protecting layer 150. The sealing part 210 extends to a sealing part line RE. The sealing part 210 may include epoxy resin, but is not limited thereto or thereby.

In the plan view, the bottleneck line BN is spaced apart from the side surface aligned with side line SL of the IC chip 200 by a first distance d1. In the plan view, the protecting layer line SR is spaced apart from the side line SL by a second distance d2. In the plan view, the sealing part line RE is spaced apart from the side line SL by a third distance d3. The second distance d2 is larger than the first distance d1. The third distance d3 is larger than the second distance d2.

The first distance d1 may be about 25 micrometers (μm) to about 75 μm. In one exemplary embodiment, the first distance d1 may be about 50 μm. The second distance d2 may be about 100 μm to about 300 μm. In one exemplary embodiment, the second distance d2 may be about 200 μm. The third distance d3 may be about 400 μm to about 600 μm. In one exemplary embodiment, the third distance d3 may be about 500 μm. Although the first distance d1 is about 25 μm to about 75 μm according to relationship of the first distance d1, the second distance d2 and the third distance d3 in the illustrated exemplary embodiment, the first to third distances d1 to d3 may have variable combinations. In an alternative exemplary embodiment, the first distance d1 may be about 25 μm to about 300 μm, and the first distance d1 may be greater than the second distance d2.

The bottleneck region of the third portion 123 of the input lead line 120 is disposed under the sealing part 210. Even when the tape package is bent such as by an external force, the portion of the base substrate 100 corresponding to the bottleneck region may be hardly bent because of the sealing part 210. Thus, a crack of the circuit pattern in the bottleneck region may be reduced or effectively prevented.

Figure 5:
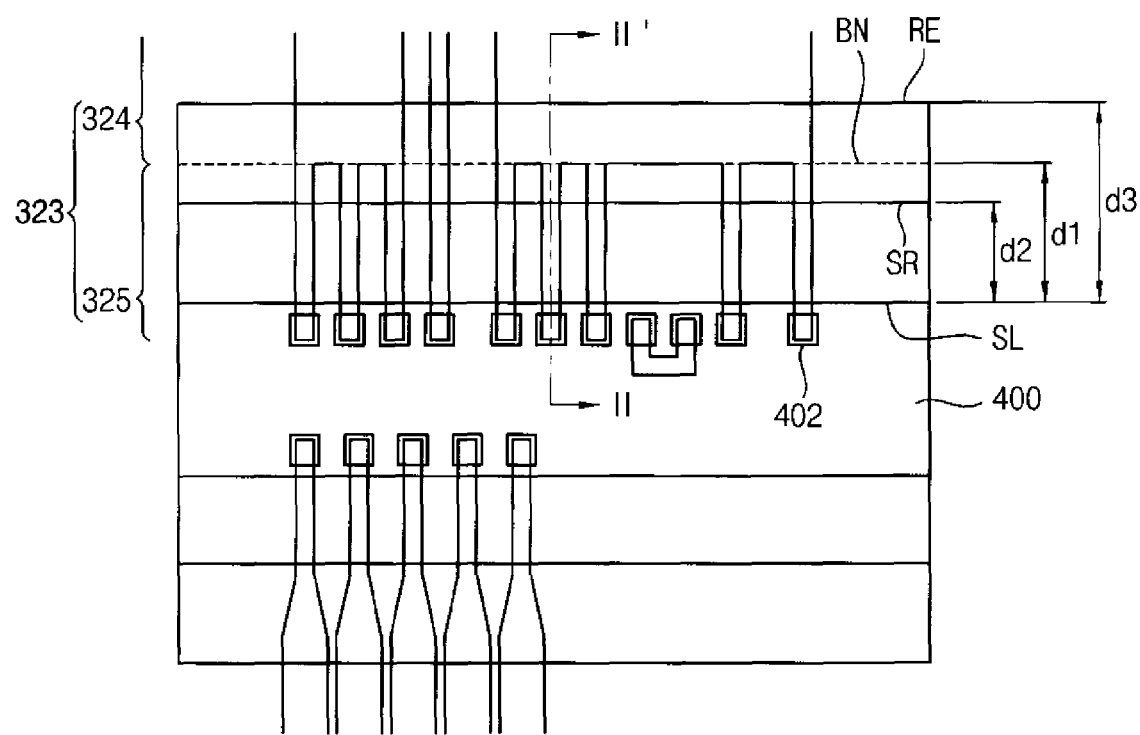
FIG. 5 is an enlarged view illustrating a portion of another exemplary embodiment of a tape package according to the invention.
Figure 6:
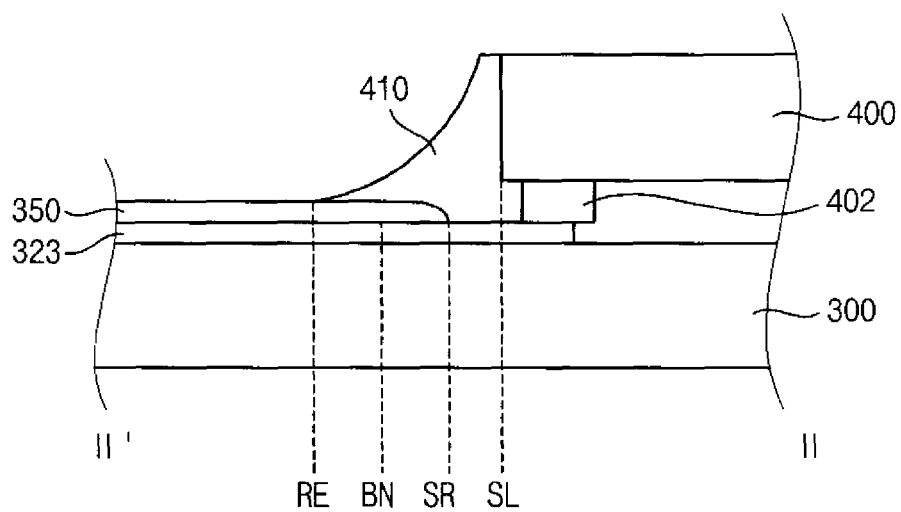
FIG. 6 is a cross-sectional view taken along line II-II' of FIG. 5.

FIG. 5 is an enlarged view illustrating a portion of another exemplary embodiment of a tape package according to the invention. FIG. 6 is a cross-sectional view taken along line II-II' of FIG. 5. The tape package of FIGS. 5 and 6 is substantially the same as the tape package of FIGS. 1 to 4, except for a bottleneck region of the input lead line and protecting layer 350. Thus, any further detailed descriptions concerning the same elements will be omitted.

Referring to FIGS. 5 and 6, the tape package includes a base substrate 300, an IC chip 400, a circuit pattern, a protecting layer 350 and a sealing part 410. The circuit pattern includes an output lead line and an input lead line.

The input lead line includes a first portion, a second portion and a third portion 323.

The third portion 323 of the input lead line includes a main input lead line 324 and a sub input lead line 325. The sub input lead line 325 branches off and extends from the main input lead line 324. The third portion 323 of the input lead line may include a plurality of sub input lead lines 325. A width of the sub input lead line 325 is smaller than a width of the main input lead line 324, so that a bottleneck region is formed between the main input lead line 324 and the sub input lead line 325.

The protecting layer 350 is disposed on and overlapping the input lead line and the output lead line. The protecting layer 350 insulates and protects a circuit pattern including the input lead line and the output lead line. The protecting layer 350 exposes a portion of the input lead line. The protecting layer 350 extends to a protecting layer line SR. A portion of the sub input lead line 325 of the third portion 323 of the input lead line is exposed by the protecting layer 350. Thus, the protecting layer 350 overlaps a bottleneck line BN which is between the main input lead line 324 and the sub input lead line 325. The protecting layer 350 may include a solder resist, but is not limited thereto or thereby.

The IC chip 400 is disposed on the IC chip mounting area (refer to 110 of FIG. 1). The IC chip 400 includes a plurality of terminals 402 disposed on a lower surface and under the IC chip 400. The terminals 402 are disposed on the exposed portion of the sub input lead line 325, so that the IC chip 400 is physically and/or electrically connected to the input lead line.

A group of terminals among the plurality of terminals 402 to which same signal is applied, may be respectively connected to the sub input lead lines 325 from a single one main input lead line 324.

The sealing part 410 surrounds the IC chip 400 to fix the IC chip 400 on the base substrate 300. The sealing part 410 covers a side surface of the IC chip 400, a portion of the input lead line and a portion of the protecting layer 350. The sealing part 410 is formed to a sealing part line RE. The sealing part 410 may include epoxy resin, but is not limited thereto or thereby.

In a plan view, the bottleneck line BN is spaced apart from a side line SL of the IC chip 400 by a first distance d1. In the plan view, the protecting layer line SR is spaced apart from the side line SL by a second distance d2. In the plan view, the sealing part line RE is spaced apart from the side line SL by a third distance d3. The first distance d1 is larger than the second distance d2. The third distance d3 is larger than the first distance d1.

The first distance d1 may be about 325 μm to about 375 μm. In one exemplary embodiment, the first distance d1 may be about 350 μm. The second distance d2 may be about 100 μm to about 300 μm. In one exemplary embodiment, the second distance d2 may be about 200 μm. The third distance d3 may be about 400 μm to about 600 μm. In one exemplary embodiment, the third distance d3 may be about 500 μm.

The bottleneck region of the third portion 323 of the input lead line is disposed under the sealing part 350. Even when the tape package is bent such as by an external force, the portion of the base substrate 300 corresponding to the bottleneck region may be hardly bent because of the sealing part 410. Thus, a crack of the circuit pattern in the bottleneck region may be reduced or effectively prevented.

Figure 7:
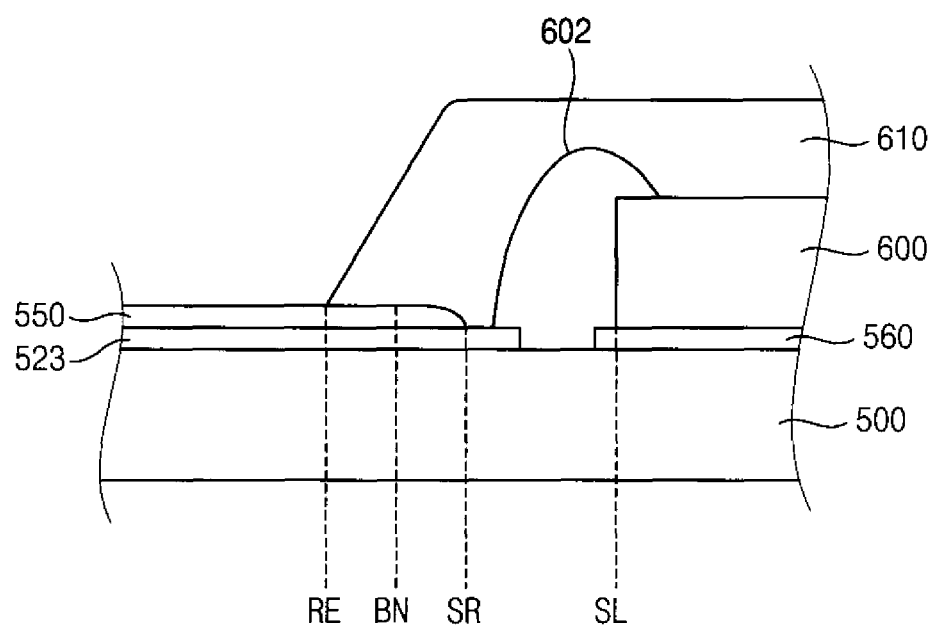
FIG. 7 is a cross-sectional view illustrating a portion of still another exemplary embodiment of a tape package according to the invention.

FIG. 7 is a cross-sectional view illustrating a portion of another exemplary embodiment of a tape package according to the invention. The tape package of FIG. 7 is substantially same as the tape package of FIGS. 5 to 6, except for a wire 602 and an adhesive layer 560. Thus, any further detailed descriptions concerning the same elements will be omitted.

The tape package includes a base substrate 500, the adhesive layer 560, an IC chip 600, an input lead line, a protecting layer 550, the wire 602 and a sealing part 610.

The adhesive layer 560 is disposed on an IC chip mounting area of the base substrate 500. The IC chip 600 is disposed on the adhesive layer 560.

The input lead line includes a first portion, a second portion and a third portion 523.

The third portion 523 of the input lead line includes a main input lead line (refer to 124 of FIG. 2) and a sub input lead line (refer to 125 of FIG. 2). The sub input lead line branches off and extends from the main input lead line. The third portion 523 of the input lead line may include a plurality of sub input lead lines. A width of the sub input lead line is smaller than a width of the main input lead line, so that a bottleneck region is formed between the main input lead line and the sub input lead line.

The protecting layer 550 is disposed on and overlapping the input lead line and the output lead line. The protecting layer 550 insulates and protects a circuit pattern including the input lead line and the output lead line. The protecting layer 550 exposes a portion of the input lead line. The protecting layer 550 extends to a protecting layer line SR. A portion of the sub input lead line of the third portion 523 of the input lead line is exposed by the protecting layer 550. Thus, the protecting layer 550 overlaps a bottleneck line BN which is between the main input lead line and the sub input lead line. The protecting layer 550 may include a solder resist, but is not limited thereto or thereby.

The IC chip 600 is disposed on the IC chip mounting area (refer to 110 of FIG. 1). The IC chip 600 is physically and/or electrically connected to the exposed sub input lead line through the wire 602. Thus, the sub input lead line is spaced apart from a side line SL of the IC chip 600 in a plan view.

The sealing part 610 covers the IC chip 600 and the wire 602 to fix the IC chip 600 and the wire 602 on the base substrate 500. The sealing part 610 covers side surfaces and a top surface of the IC chip 600, a portion of the input lead line, a portion of the protecting layer 550 and the wire 602. The sealing part 610 extends to a sealing part line RE. The sealing part 610 may include epoxy resin, but is not limited thereto or thereby.

The bottleneck region of the third portion 523 of the input lead line is disposed under the sealing part 550. Even when the tape package is bent such as by an external force, the portion of the base substrate 500 corresponding to the bottleneck region may be hardly bent because of the sealing part 610. Thus, a crack of the circuit pattern in the bottleneck region may be reduced or effectively prevented.

FIGS. 8A to 8B are cross-sectional views of exemplary embodiments of a display apparatus according to the invention.

Referring to FIG. 8A, the display apparatus includes a display panel 710, a driving part 720, an upper receiving container 740, a body 730 and a tape package 760.

The display panel 710 displays an image. The display panel 710 includes an array substrate and an opposite substrate which are coupled to each other. A portion of the array substrate is exposed at a side of the display panel 710, so that the exposed portion of the array substrate may be connected to the tape package 760.

The upper receiving container 740 receives the display panel 710. The display panel 710 and the upper receiving container 740 may rotate with respect to a pivot axis such as including a hinge 742, so that a user may access a display area of the display panel 710.

The driving part 720 drives the display panel 710. The driving part 720 is electrically connected to the display panel 710 through the tape package 760. The driving part 720 is disposed under the display panel 710.

The tape package 760 is substantially same as the tape package of FIGS. 1 to 4, but is not limited thereto. The tape package 760 includes an IC chip 762, and a sealing part 764 fixing the IC chip 762.

The tape package 760 connects the display panel 710 to the driving part 720, so that the tape package 760, and may be bent in a C-shape. In addition, the IC chip 762 may be disposed under the driving part 720. Thus, when the display panel 710 and the upper receiving container 740 rotate with respect to the hinge 742, the tape package 760 is bent, but the tape package 760 may still maintain an electrical connection of the display panel 710 to the driving part 720.

When an external force is applied to the tape package 760 such as by rotating the display panel 710 and the upper receiving container 740 with respect to the hinge 742, cracking of a circuit pattern of the tape package 760 may be reduced or effectively prevented, because a bottleneck region of an input lead line of the tape package 760 is disposed under the sealing part 764 (refer FIG. 4).

Figure 10:
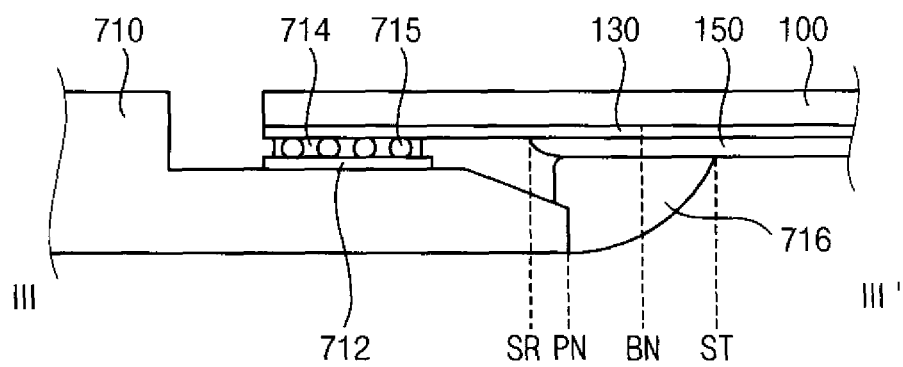
FIG. 10 is a cross-sectional view taken along line III-III' of FIG. 9.

In addition, a bottleneck region of a third portion of the output lead line is disposed on a reinforcing part (refer to 716 of FIG. 10). Even when the tape package is bent such as by an external force, a portion of the tape package 760 corresponding to the bottleneck region may be hardly bent because of the reinforcing part 716. Thus, a crack of the circuit pattern in the bottleneck region may be reduced or effectively prevented.

Referring to FIG. 8B, the display apparatus may further include a lower receiving container 750. The lower receiving container 750 receives the body 730, the driving part 720 and the tape package 760 therein.

In an exemplary embodiment of a manufacturing process of assembling the lower receiving container 750, the tape package 760 may be forced in an upper direction when the tape package 760 contacts an inner surface of the lower receiving container 750. Thus, an external force is applied to the tape package 760 and the tape package 760 is deformed toward the display panel 710. The bottleneck region of the input lead line of the tape package 760 is disposed under the sealing part 764 (refer FIG. 4), so that a crack of a circuit pattern of the tape package 760 may be reduced or effectively prevented, even though an external force is applied to the tape package 760 such by rotating the display panel 710 and the upper receiving container 740 with respect to the hinge 742.

In addition, the bottleneck region of the third portion of the output lead line is disposed on the reinforcing part (refer to 716 of FIG. 10). Even when the tape package is bent by an external force, a portion of the tape package 760 corresponding to the bottleneck region may be hardly bent because of the reinforcing part. Thus, a crack of the circuit pattern in the bottleneck region may be reduced or effectively prevented.

Figure 9:
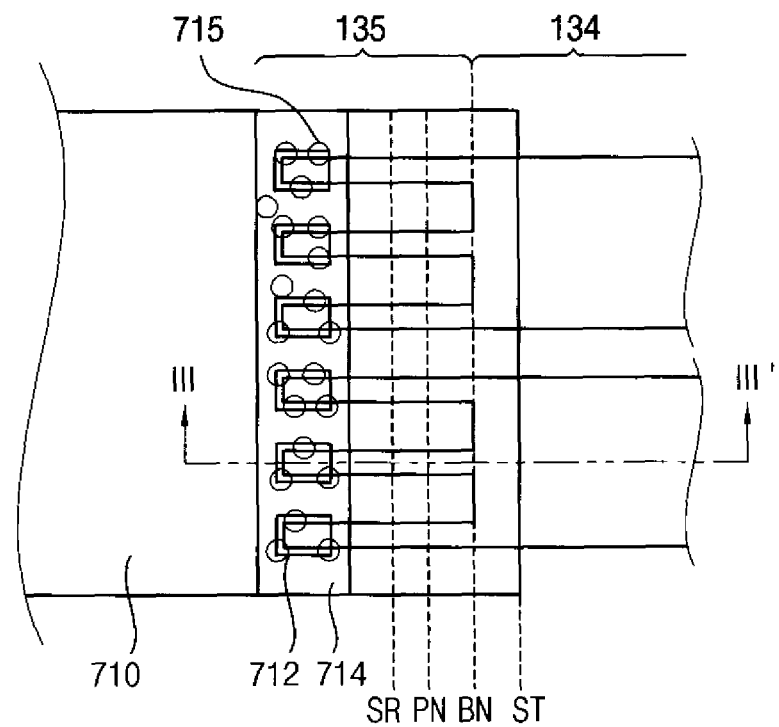
FIG. 9 is an enlarged view illustrating portion 'C' of FIG. 1.

FIG. 9 is an enlarged view illustrating portion 'C' of FIG. 1. FIG. 10 is a cross-sectional view taken along line III-III' of FIG. 9.

Referring to FIGS. 9 and 10, the figures illustrate a shape of the tape package of FIG. 1 which is connected to a display panel 710. The tape package includes a base substrate 100, an output lead line 130 and a protecting layer 150. The display panel 710 includes a terminal 712 and a conductive adhesive layer 714. The tape package in FIGS. 9 and 10 is illustrated upside down comparing to FIGS. 3 and 4. The tape package is substantially same as the tape package of FIGS. 1 to 4, but is not limited thereto or thereby. Thus, any further detailed descriptions concerning the same elements will be omitted.

The output lead line 130 includes a first portion, a second portion and a third portion.

The third portion of the output lead line includes a main output lead line 134 and a sub output lead line 135. The sub output lead line 135 branches off and extends from the main output lead line 134. The third portion 133 of the output lead line 130 may include a plurality of sub output lead lines 135. A width of the sub output lead line 135 is smaller than a width of the main output lead line 134, so that a bottleneck region is formed between the main output lead line 134 and the sub output lead line 135.

The protecting layer 150 is disposed under the output lead line 130. The protecting layer 150 insulates and protects a circuit pattern including the output lead line 130. The protecting layer 150 exposes a portion of the output lead line 130. The protecting layer 150 extends to a protecting layer line SR. A portion of the sub output lead line 135 of the third portion of the output lead line 130 is exposed by the protecting layer 150. Thus, the protecting layer 150 overlaps a bottleneck line BN which is between the main output lead line 134 and the sub output lead line 135. The protecting layer 150 may include a solder resist, but is not limited thereto or thereby.

A reinforcing part 716 covers a side of the display panel 710 and a portion of protecting layer 150. The reinforcing part 716 may extend to a reinforcing part line ST. The reinforcing part 716 attaches and fixes the tape package on the display panel 710, and reinforces strength of the tape package. The reinforcing part 716 includes a flexible material capable of reinforcing the strength of the tape package. In one exemplary embodiment, for example, the reinforcing part 716 may include silicon, but is not limited thereto or thereby.

The display panel 710 includes an array substrate and an opposite substrate. A portion of the array substrate is exposed at a side of the display panel 710, so that a terminal 712 of the display panel 710 disposed on the array substrate may be connected to the tape package.

The conductive adhesive layer 714 is disposed on the terminal 712 of the display panel 710. The conductive adhesive layer 714 includes a conductive material, so that a plurality of conductive channels or elements 715 spaced apart each other are in the conductive adhesive layer 714. Thus, although the conductive adhesive layer 714 overlaps and connects to a plurality of terminals 712 of the display panel 710, the terminals 712 may not be electrically connected to each other.

The sub output lead line 135 is connected to the conductive adhesive layer 714, so that the terminal 712 of the display panel 710 is electrically connected to the sub output lead line 135.

In a plan view, the bottleneck line BN is disposed between a side line PN of the display panel 710 and the reinforcing part line ST. In addition, the bottleneck line BN is disposed between the protecting layer line SR and the reinforcing part line ST. The bottleneck line BN may be spaced apart from the side line PN of the display panel 710 by about 0.5 millimeter (mm) to about 1.3 millimeters (mm).

Thus, the bottleneck region of the third portion of the output lead line is disposed on the reinforcing part 716. Even when the tape package is bent by an external force, a portion of the base substrate 100 corresponding to the bottleneck region may be hardly bent because of the reinforcing part 716. Thus, a crack of the circuit pattern in the bottleneck region may be reduced or effectively prevented.

According to one or more exemplary embodiment of the invention, the tape package includes the base substrate, the bottleneck region of the third portion of the input lead line and the sealing part. The bottleneck region of the third portion of the input lead line is disposed under the sealing part. Even when the tape package is bent by an external force, the portion of the base substrate corresponding to the bottleneck region may be hardly bent because of the sealing part. Thus, a crack of the circuit pattern in the bottleneck region may be reduced or effectively prevented.

In addition, a display apparatus includes the tape package having the bottleneck region of the third portion of the output lead line, the reinforcing part and the display panel. The bottleneck region of the third portion of the output lead line is disposed on the reinforcing part. Even when the tape package is bent by an external force, a portion of the tape package corresponding to the bottleneck region may be hardly bent because of the reinforcing part. Thus, a crack of the circuit pattern in the bottleneck region may be reduced or effectively prevented.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A tape package comprising:
    a base substrate;
    an input lead line on the base substrate and comprising:
        a main input lead line elongated in a first direction; and
        a branched portion extending from the main input lead line to define a plurality of sub input lead lines each elongated in the first direction and having a width smaller than a width of the main input lead line;
    an integrated circuit chip electrically connected to the sub input lead lines; and
    a sealing part which fixes the integrated circuit chip on the base substrate, and overlaps the main input lead line,
    wherein among the first direction elongated sub input lead lines extending from the first direction elongated main input lead line, each sub input lead line electrically connected to the integrated circuit chip extends directly from the first direction elongated main input lead line.

2. The tape package of claim 1, further comprising a protecting layer which overlaps a portion of the input lead line.

3. The tape package of claim 2, wherein the protecting layer overlaps the main input lead line, and the sealing part overlaps the plurality of sub input lead lines and a portion of the protecting layer.

4. The tape package of claim 3, wherein a distance between a side surface of the integrated circuit chip, and a boundary between the main input lead line and the plurality of sub input lead lines, is about 25 micrometers to about 250 micrometers.

5. The tape package of claim 4, wherein a distance from the side surface of the integrated circuit chip to the protecting layer is about 100 micrometers to about 300 micrometers.

6. The tape package of claim 5, wherein a distance between the side surface of the integrated circuit chip and the sealing part is about 400 micrometers to about 600 micrometers.

7. The tape package of claim 2, wherein the protecting layer exposes a portion of the main input lead line, and the sealing part overlaps the plurality of sub input lead lines, the exposed portion of the main input lead line and a portion of the protecting layer.

8. The tape package of claim 1, further comprising a wire which connects the integrated circuit chip to the plurality of sub input lead lines.

9. The tape package of claim 1, wherein the base substrate is a flexible substrate.

10. The tape package of claim 1, wherein a sum of the widths of the plurality of sub input lead lines is smaller than the width of the main input lead line.

11. The tape package of claim 1, wherein the input lead line further comprises a first portion, a second portion connected to the first portion, and a third portion comprising the main input lead line and the plurality of sub input lead lines, and a width of the first portion is larger than a width of the third portion.

* * * * *